Aug. 25, 1970 E. K. VON FANGE ET AL 3,525,824

ISOLATION MEANS FOR A SWITCH TUNER WAFER

Filed March 14, 1968 2 Sheets-Sheet 1

INVENTORS:
EUGENE K. VON FANGE,
SANJAR GHAEM-MAGHAMI,
BY Francis H. Boos, Jr.
THEIR ATTORNEY.

ISOLATION MEANS FOR A SWITCH TUNER WAFER

Filed March 14, 1968 2 Sheets-Sheet 2

INVENTORS:
EUGENE K. VON FANGE,
SANJAR GHAEM-MAGHAMI,
BY Francis H. Boos, Jr.
THEIR ATTORNEY.

United States Patent Office 3,525,824

Patented Aug. 25, 1970

3,525,824

ISOLATION MEANS FOR A SWITCH TUNER WAFER

Eugene K. Von Fange and Sanjar Ghaem-maghami, Chesapeake, Va., assignors to General Electric Company, a corporation of New York Filed Mar. 14, 1968, Ser. No. 713,046
Int. Cl. H01h *19/58;* H05k *1/16*
U.S. Cl. 200—11 10 Claims

ABSTRACT OF THE DISCLOSURE

A copper coating overlays a planar dielectric member to form a wafer for a switch tuner. The copper coating forms a plurality of planar conductive elements having characteristic inductances at high frequencies and lying outside but connected to a circular contact area including contact elements comprising silver plate. The contact elements are positioned in a series array and separated by silver plated conductive islands.

BACKGROUND OF THE INVENTION

This invention relates to a switch tuner, and more specifically, it relates to a wafer construction for a switch tuner.

As commonly found in the art, the switch tuner comprises one or more stators or wafers supporting planar conductive patterns and further comprises one or more corresponding rotors or rotatable switch members for variably connecting the planar conductive elements. Since each of the planar conductive elements possesses a characteristic inductance at high frequencies which may be visualized as a conventional coil, the connection of these elements in various combinations will produce a variable or tunable inductance.

In the tuner industry, the switch tuner has long provided an inductively tuned alternative for the turret tuner, particularly in VHF tuners for television receivers. Yet, manufacturers of television receivers have generally preferred the turret tuner, a preference which is no doubt attributable to the somewhat superior performance of the turret tuner.

One cause of the inferior performance of the switch tuner lies in the undesirable mutual coupling between conductive portions on the tuner wafers. A portion of this undesirable mutual coupling may be attributed to close spacing between planar conductive elements which serve as the inductors on the tuner wafers. Another disadvantage of this close spacing is that it allows simultaneous contact of two contact elements by the rotor. This close spacing has been particularly common in prior art wafers manufactured by conventional printed circuit board techniques wherein efforts were made to confine the conductive elements within a stator contact area. Another portion of this undesirable mutual coupling may be attributed to close spacing between the individual contact elements of the stator contact area. Once again, this close spacing has been particularly common in prior art wafers manufactured by printed circuit board techniques which attempt to achieve a substantially continuous contact surface. However, the close spacing may occur in any switch tuner wafer which utilizes a laminated conductive contact element and seeks to prevent the rotor contact contamination resulting from contact with the wafer dielectric.

SUMMARY OF THE INVENTION

Therefore, and in view of the foregoing, it is a first object of this invention to achieve a switch tuner wafer which is free of undesirable mutual coupling at the stator contact area.

It is a further object of this invention to achieve the foregoing without contamination of the rotor contacts.

And, it is a still further object of this invention to achieve a wafer which may be substantially free of mutual coupling between all conductive portions of the wafer.

In one embodiment of the invention, there is provided a switch tuner wafer including a dielectric member and a contact area comprising a plurality of contact elements laminating the dielectric member in a series array. The contact area further comprises insulated conductive islands mutually isolating the contact elements.

BRIEF DESCRIPTION OF THE DRAWINGS

This specification concludes with claims particularly pointing out and distinctly claiming the subject matter which is regarded as the invention. The invention may also be understood from the following description taken in connection with the accompanying drawings in which:

DESCRIPTION OF THE PREFERRED EMBODIMENTS

Figure 1:
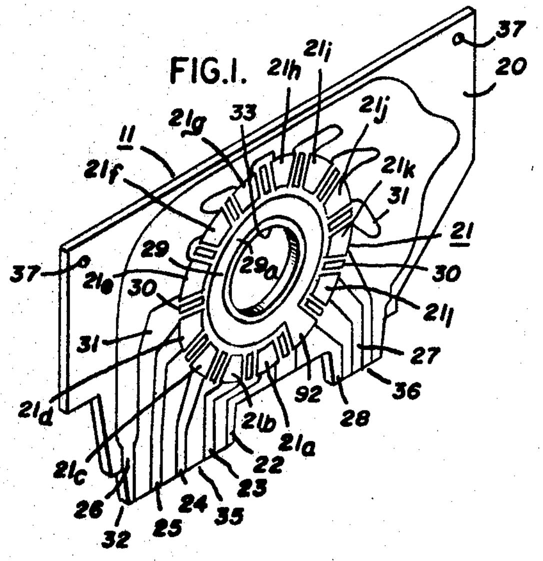
FIG. 1 is a perspective view of the conductive side of a wafer.
Figure 2:
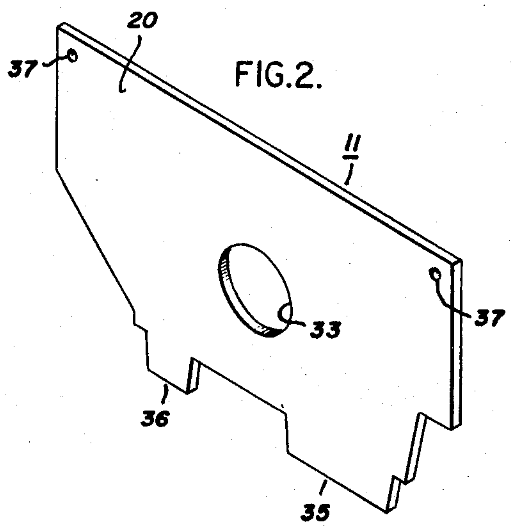
FIG. 2 is a perspective view of the non-conductive side of a wafer.

In the embodiment shown in FIGS. 1 and 2, a wafer 11 comprises a dielectric member 20 carrying an outermost arcuate or circular contact area 21 including a series array of silver plated contact elements 21(*a*–1) laminating the dielectric member 20. The plurality of contact elements 21(*a*–1) are connected to copper planar conductive elements 22–27 at one or more points. The wafer further comprises a second arcuate or circular contact area 29 including a silver plated contact element 29*a* connected to a copper planar conductive element 28 by an interconnecting silver plated conductive segment 92. The wafer may be tuned by serially connecting element 28 to elements 22–27 in various combinations through variably electrically connecting the contact elements 21(*a*–1) and 29*a*.

Since it is desirable to maintain the rotor contacts substantially free of non-conductive material, it becomes necessary to maintain a nearly continuous silver surface in the contact area 21 so as to avoid rotor contact engagement with the dielectric member 20. However, placement of the individual contact elements 21(*a*–1) in mutually close proximity will result in undesirable mutual coupling. In order to avoid this mutual coupling, the contact elements 21(*a*–1) are separated by silver plated conductive islands 30 in insulative voids 31 which serve to isolate the contact elements 21(*a*–1) and contact element 29*a*.

In order to prevent mutual coupling between the planar conductive elements 22–28, planar conductive elements 22–28 are all positioned outside the circular contact area 21. As a result, the crowding of conductive elements inherent in the prior art confinement of these elements within the contact area is avoided.

Further advantages result from the positioning of the elements 22–28 outside the circular contact area 21. First, since the conductive elements radiate toward the edges of the dielectric member 20, electronic components may be connected to the elements 22–28 by expedients such as printed circuit boards. In particular, the intersection of the elements 22–28 with an imaginary line drawn tangent to the circular contact area 21 and parallel to dielectric member edge 32 permits electrical connection of all elements 22–28 to a single printed circuit board as shown in FIGS. 5 and 6.

Second, the position of the elements 22–28 outside the contact area 21 eliminates the need for conductive elements of narrow widths. As a result, the tolerances and widths of the conductive elements 22–28 are sufficiently loose to permit etching by cost-saving printed circuit board techniques. This means that the conductive elements 22–28 may be coated on the dielectric member 20 at the time of formation thereby eliminating the expense of a separate manufacturing step for securing the elements 22–28 may be coated on the dielectric member 20 at the The wafer 11 also includes a number of mechanical features which adapt it for an assembly mounting. These features include a central aperture 33 which will receive a rotor shaft, a pair of legs 35 and 36 which may be inserted in a printed circuit board, and a pair of apertures 37 which receive assembly mounting rods for securing the wafer 11 in place.

Figure 3:
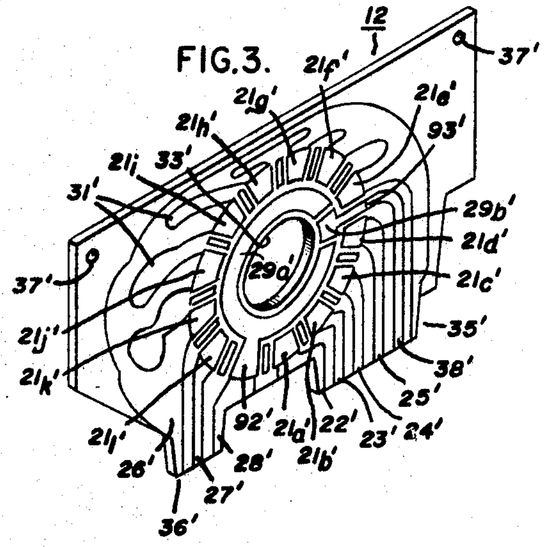
FIG. 3 is a perspective view of a wafer with a modified conductive pattern.
Figure 4:
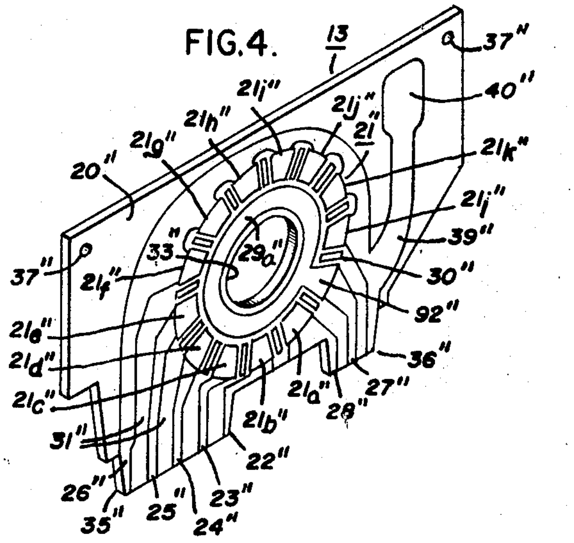
FIG. 4 is a perspective view of a wafer with a still further modified conductive pattern.

A wafer 12, which is capable of another tuning function although substantially a mirror image of the wafer 11, is shown in FIG. 3 with corresponding element numbers primed. As shown there, a silver plated segment 93′ which connects an additional contact element 29*b′* with another planar conductive element 38′ serves to mutually isolate the contact elements 21*d′* and 21*e′*. Similarly, the wafer 13 which is capable of yet another tuning function is shown in FIG. 4 with element numbers corresponding to the element numbers of the wafer 11 double primed. The wafer 13 also includes a planar conductive element 39″ which may be connected to external circuitry, such as fine tuning means, at a contact point 40″.

Figure 5:
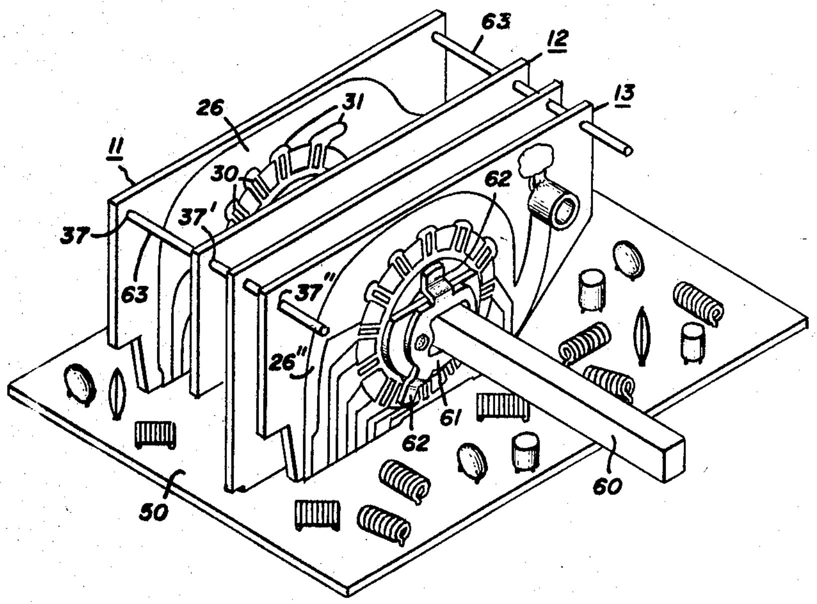
FIG. 5 is a perspective view above a switch tuner assembly comprising a plurality of wafers.
Figure 6:
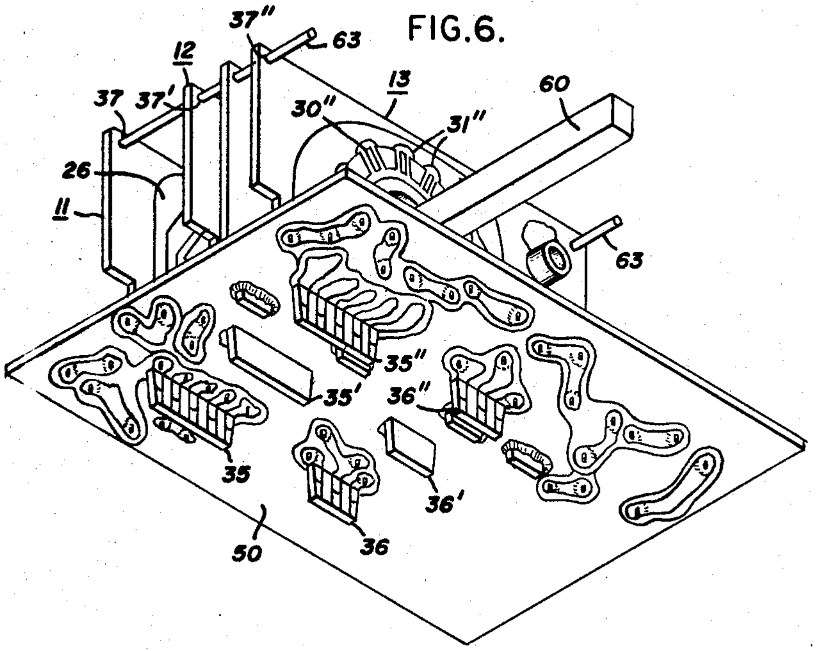
FIG. 6 is a perspective view below the switch tuner assembly of FIG. 5.

In order to demonstrate the function of the conductive islands 30 as a means of preventing rotor contact contamination, a tuner assembly is shown in FIGS. 5 and 6. In the assembly, wafers 11, 12, and 13 are mounted on a printed circuit board 50 by means of legs 35, 35′, 35″ and 36, 36′, 36″ extending through the board 50 and rods 63 extending through apertures 37, 37′, 37″. The rotor shaft 60 which extends through apertures 33, 33′, 33″, carries a rotor contact member 61 for each wafer 11–13. Contact member 61 includes two contact portions 62 which sweep over the series array of contact elements 21(*a*–1), 21(*a*–1)′, 21(*a*–1)″ and the conductive islands 30, 30′, 30″ in the insulative voids 31, 31′, 31″. As a result, the rotor contacts are unable to engage the dielectric of the wafers and isolation between the contact elements is achieved.

In the foregoing, the description has been directed to wafers particularly adapted for use in VHF tuners for television receivers. This has been done since it is believed that the particular wafer construction for a switch tuner is particularly suitable to today's television market. However, the tuner is also suitable for other markets which require a superior performance tuner at reduced cost.

Although specific embodiments of the invention have been shown, it is not desired that the invention be limited to any particular form shown, and it is intended by the appended claims to cover all modifications within the spirit and scope of the invention.

What is claimed as new and desired to be secured by Letters Patent of the United States is:

1. A switch tuner wafer comprising:

a dielectric member, a plurality of planar conductive elements laminating said dielectric member and each having a characteristic inductance at high frequencies, and a contact area comprising a series array of contact elements laminating said dielectric member and being electrically connected to said inductive planar conductive elements, said contact area further comprising isolating conductive islands laminating said dielectric member in the insulative voids between said contact elements.

2. The switch tuner wafer as recited in claim 1, wherein said planar conductive elements comprise a first conductive material, and said contact elements and conductive islands comprise a second conductive material.

3. The switch tuner wafer as recited in claim 2 wherein said first conductive material comprises copper and coats said dielectric member forming a continuum therewith, said second conductive material comprises silver and plates said dielectric member forming a continuum therewith.

4. The switch tuner as recited in claim 1, wherein said series array is substantially arcuate.

5. The switch tuner wafer as recited in claim 1 wherein said series array is substantially circular.

6. The switch tuner wafer as recited in claim 5 wherein all said planar conductive elements lie outside said circular series array.

7. The switch tuner wafer as recited in claim 6 including another contact element within said circular series array, and a conductive segment connecting said another contact element to one of said planar conductive elements, said conductive segment separating two of said contact elements of said series array.

8. A switch tuner wafer comprising:

a dielectric member, a substantially circular contact area of a first radius secured to said dielectric member, said circular contact area comprising a plurality of contact elements plating said dielectric member and forming a continuum therewith, said contact area further comprising an isolating conductive island in the insulative void between each of said contact elements, said islands plating said dielectric member;

a second contact area positioned within said first contact area and comprising at least one contact element plating said dielectric member and forming a continuum therewith;

and a plurality of planar conductive elements coating said dielectric member to form a continuum therewith and each having a characteristic inductance at high frequencies, all said planar conductive elements lying outside of and radiating away from said circular contact area such that more than one of said conductive elements would intersect a line drawn tangent to said circular contact area, said conductive elements being individually connected to said contact elements.

9. The switch tuner wafer as recited in claim 8 wherein said contact elements and said conductive islands comprise silver.

10. The switch tuner wafer as recited in claim 9 wherein said planar conductive elements comprise copper.

References Cited

UNITED STATES PATENTS

| | | | |
|---|---|---|---|
| 2,896,033 | 7/1959 | Hartz. | |
| 3,089,923 | 5/1963 | Wright. | |
| 3,261,929 | 7/1966 | Neff. | |
| 3,398,245 | 8/1968 | Hartsock. | |
| 3,213,458 | 10/1965 | Hansel et al. ---- | 343—854 XR |

ROBERT K. SCHAEFER, Primary Examiner

J. R. SCOTT, Assistant Examiner

U.S. Cl. X.R.

317—101; 343—854